United States Patent [19]
Ikuzawa et al.

[11] Patent Number: 5,410,245
[45] Date of Patent: Apr. 25, 1995

[54] METHOD AND APPARATUS FOR CALIBRATING ELECTRONIC SCALES FOR THE HORIZONTAL AXIS

[75] Inventors: Kenzo Ikuzawa; Kentaro Ozawa; Susumu Mogi; Hirohisa Mita; Kouji Furihata, all of Kanagawa, Japan

[73] Assignee: Leader Electronics Corp., Kanagawa, Japan

[21] Appl. No.: 98,799

[22] Filed: Jul. 29, 1993

[30] Foreign Application Priority Data

Jul. 31, 1992 [JP] Japan .................. 4-204783

[51] Int. Cl.$^6$ .............................. G01R 1/04
[52] U.S. Cl. .......................... 324/74; 345/14; 348/194; 327/134
[58] Field of Search .................. 345/134, 13, 14; 324/73–74, 121 R, 130–130.1, 175, 601, 606; 348/194; 328/185; 307/228

[56] References Cited

U.S. PATENT DOCUMENTS

| | | | |
|---|---|---|---|
| 3,840,302 | 10/1974 | Brunton et al. | 356/167 |
| 4,196,629 | 8/1980 | Philips | 73/593 |
| 4,540,982 | 9/1985 | Jalovec | 340/73 |
| 4,542,339 | 9/1985 | Iwakura et al. | 324/121 R |
| 4,553,091 | 11/1985 | Bristol | 324/73 |
| 4,581,585 | 4/1986 | Bristol | 328/185 |

FOREIGN PATENT DOCUMENTS

| | | |
|---|---|---|
| 59-148876 | 8/1984 | Japan . |
| 59-148877 | 8/1984 | Japan . |
| 63-106568 | 5/1988 | Japan . |
| 63-286775 | 11/1988 | Japan . |

*Primary Examiner*—Kenneth A. Wieder
*Assistant Examiner*—Barry C. Bowser
*Attorney, Agent, or Firm*—Fish & Richardson

[57] ABSTRACT

A method and apparatus of calibrating electronic scales for the horizontal axis of an oscilloscope is provided. For each of two electronic scales or cursors, output voltages of a horizontal deflection circuit are generated. A measurement is made to determine a time interval in which the voltage of a sweep waveform, generated by a sweep waveform generator and appearing at the output of the horizontal deflection circuit, passes the two output voltages. The slope of the sweep waveform generated by the sweep waveform generator is adjusted such that the time interval coincides with a target time interval.

10 Claims, 4 Drawing Sheets

METHOD AND APPARATUS FOR CALIBRATING ELECTRONIC SCALES FOR THE HORIZONTAL AXIS

BACKGROUND OF THE INVENTION

1. Field of the Invention

The present invention relates to calibration of the horizontal axis of an oscilloscope, and more particularly to a method and apparatus for calibrating electronic scales for the horizontal axis.

2. Description of the Related Art

Generally, in oscilloscopes, a horizontal axis deflection circuit must be calibrated such that each position on a horizontal axis scale (positions div 0–div 10, see FIG. 4) of the coordinates on the screen of a CRT represents a corresponding time in any selected time base range (or any sweep time).

Such a method of calibrating the horizontal axis has been disclosed in Japanese Patent Application Public-Disclosure No. 59-148877, entitled "Automatic Calibration Apparatus for a Sweep Waveform Generator." This method performs calibration of the horizontal axis by adjusting the slope of a sweep waveform. More specifically, a measurement is made with respect to an elapsed time in which a positive ramp portion of a sweep voltage waveform (saw-tooth wave) generated at the output of a sweep waveform generator passes through two voltage points selected in a waveform voltage range thereof (or two corresponding points on a horizontal axis scale on the screen). Then, the slope of the positive ramp portion of the sweep waveform is adjusted such that the elapsed time coincides with a target time difference in the selected time base range. Other calibration methods similar to the above have also been disclosed in Japanese Patent Application Public-Disclosure No. 63-106568, entitled "Automatic Calibration Apparatus for a Sweep Waveform Generator" and No. 63-286775 entitled "Automatic Calibration Apparatus for a Ramp Waveform Generator."

The above-mentioned prior arts all relate to calibration of a sweep waveform with respect to a scale fixed on the screen or on-screen scale (this type of scale is hereinafter also called the "physical scale" in order to distinguish it from an electronic scale such as a cursor). The physical scale is inconvenient for performing highly accurate measurements. Japanese Patent Application Public-Disclosure No. 59-148876 entitled "Vertical Calibration Method and Apparatus for an Oscilloscope" discloses a technique for calibrating electronic scales or cursors (a pair of cursors consisting of a reference cursor and a delta (Δ) cursor) for the vertical axis, however, this technique is not intended for calibration of electronic scales with respect to the horizontal axis of an oscilloscope.

Also, the above-mentioned sweep waveform calibration performs adjustment of the slope of the sweep waveform on the basis of a sweep waveform generated at the output of a sweep waveform generator. In other words, the output of a horizontal deflection circuit to which the sweep waveform is applied is not used for calibration. Thus, it is possible for the sweep speed of a sweep waveform calibrated by the prior art not to coincide with the physical scale in a used time base range due to variations in the characteristics of a horizontal sweep circuit (for example, variations in temperature, supply voltage, and characteristics caused by aging of electronic components).

SUMMARY OF THE INVENTION

The present invention provides a method and apparatus for directly calibrating electronic scales of an oscilloscope which allows measurements to be taken with a higher degree of accuracy than a physical scale.

The present invention easily and accurately calibrate electronic scales for the horizontal axis.

The present invention to enables measurements to be taken with in a higher accuracy than that based on a physical scale and a displayed waveform of a signal under measurement.

To achieve these advantages, the present invention directly calibrates electronic scales on the horizontal axis of a CRT.

More specifically, a method of calibrating electronic scales for the horizontal axis of an oscilloscope having a screen according to the present invention comprises the steps of: for at least first and second electronic scales for the horizontal axis, determining first and second electronic scale signals having values corresponding to displayed positions of said first and second electronic scales on time screen of the oscilloscope; sequentially applying the first and second electronic scale signals to a horizontal deflection circuit to derive a first deflection output and a second deflection output from an output of the horizontal deflection circuit; generating a sweep waveform including a sweeping waveform portion having an adjustable slope; applying the sweep waveform to the horizontal deflection circuit to derive a third deflection output from the horizontal deflection circuit in response to the sweep waveform; measuring a time interval from a time at which a portion of the third deflection output corresponding to the sweeping waveform portion takes the value of the first deflection output to a time at which the portion takes the value of the second deflection output; and adjusting the slope of the sweep waveform in response to the measured time interval and a target time interval between the displayed positions of the first and second electronic scales.

Further, a calibration apparatus of the present invention is adapted for use in an oscilloscope having a display screen; a horizontal deflection circuit; electronic scale signal generating means for generating, for at least first and second electronic scales for the horizontal axis displayed on the screen, first and second electronic scale signals having values corresponding to displayed positions of said first and second electronic scales on the screen of the oscilloscope; and sweep waveform generating means for generating a sweep waveform including a sweeping waveform portion having an adjustable slope, and comprises: detecting means for detecting an output of the horizontal deflection circuit; time interval measuring means coupled to receive an output from said detecting means, said measuring means being operative to receive a first detected output and a second detected output from the detecting means, the first and second detected outputs being generated when the first and second electronic scale signals are sequentially applied to the horizontal deflection circuit, the measuring means being operative to receive a third detected output from the detection means which is derived when the sweep waveform is applied to the horizontal deflection circuit, said measuring means being operative to generate a measured time interval signal representative of a time interval between a time at which a portion of the third detected output corresponding to the sweeping waveform portion takes the value of the first detection output and a time at which the portion takes the value of the second detected output; and control means responsive to the value of the measured time interval and the value of a target time interval between the displayed positions of the first and second electronic scales for generating a control signal to be applied to the sweep waveform generating means in order to adjust the slope of the sweep waveform.

In the present invention, the first and second electronic scales can be calibrated in one or more time base ranges of the oscilloscope. Also, the first and second electronic scales can be calibrated for each of one or more sweep waveforms generated by the sweep waveform generating means.

BRIEF DESCRIPTION OF THE DRAWINGS

The present invention will hereinafter be explained with reference to the accompanying drawings.

DETAILED EXPLANATION OF THE INVENTION

Figure 1:
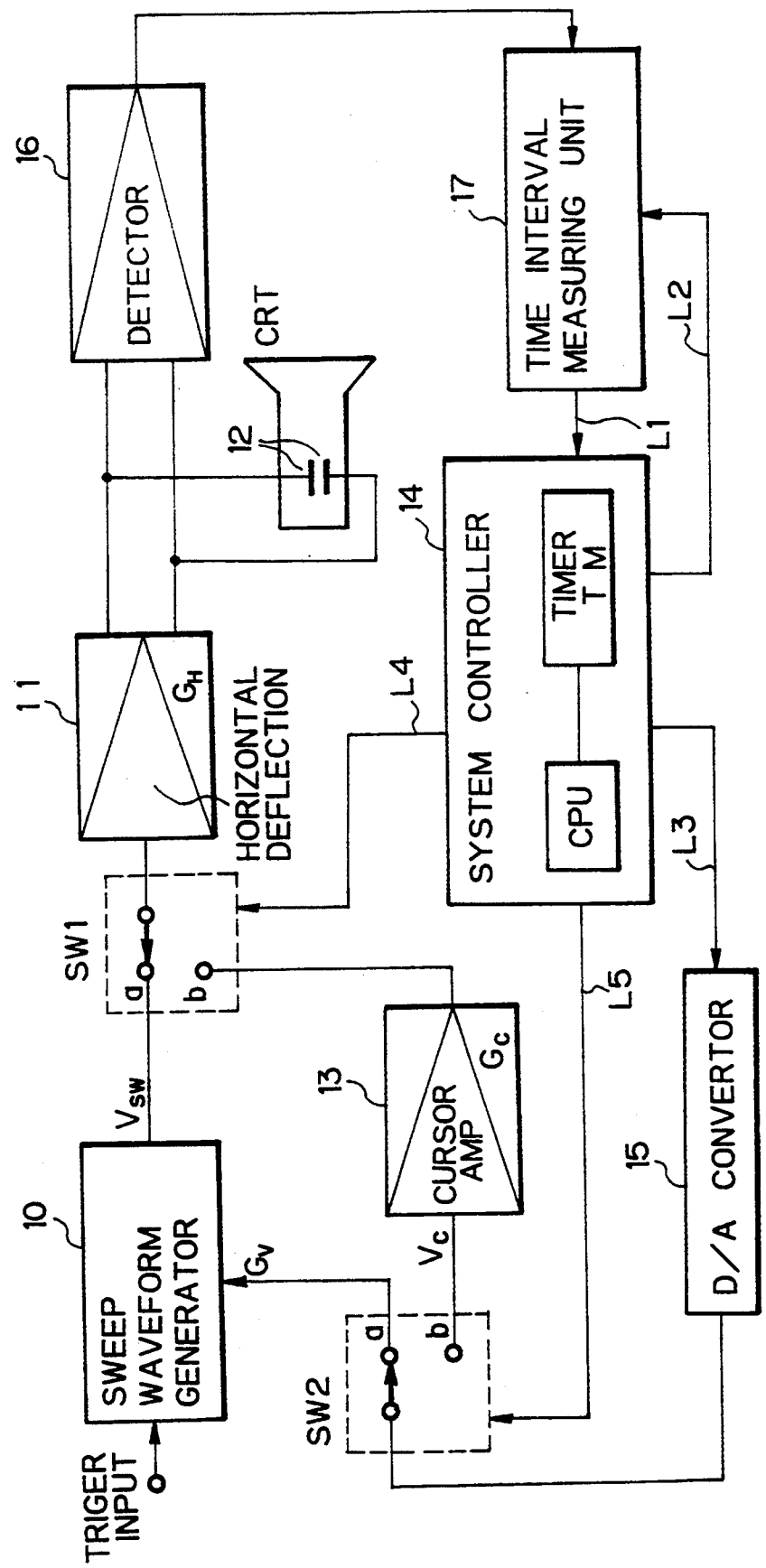
FIG. 1 is a block diagram showing a horizontal axis circuit in an oscilloscope which incorporates an apparatus for calibrating electronic scales of the horizontal axis according to the present invention.

FIG. 1 shows a horizontal axis circuit for an oscilloscope which has a calibration circuit of the present invention built therein. The horizontal axis circuit comprises a sweep waveform (normally, saw-tooth wave) generator 10, a horizontal deflection circuit 11 and a pair of horizontal deflection plates 12 for a CRT. Also provided in the horizontal axis circuit is a cursor amplifier 13 for a pair of electronic scales, i.e., a reference cursor $C_R$ and a delta cursor $C_D$. For calibrating the cursors, there are provided a system controller 14, a D/A (digital-to-analog) convertor 15, a detector 16, and a time interval measuring unit 17 (details of which are shown in FIG. 2).

Specifically, the sweep waveform generator 10 has a trigger input terminal for starting sweep, an output terminal for sending a generated sweep waveform $V_{SW}$ to a terminal a of a switch SW1, and an input terminal for receiving a signal $G_V$ from a terminal a of a switch SW2 for specifying the slope of the sweep waveform. The generator 10 is of a known structure, and comprises, although not shown, three capacitors (100 pF, 1000 pF, 1 μF) and 12 resistors (500 Ω, 1KΩ, 2.5KΩ, 5KΩ, 10KΩ, 25KΩ, 50KΩ, 100KΩ, 250KΩ, 500KΩ, 1MΩ, 2.5MΩ), by way of example, for generating sweep waveforms at a variety of sweep speeds (for example, 24 different sweep times ranging from 10 ns/div to 0.5 s/div). In the present embodiment, the 24 time-base ranges are divided into three groups, each of which is calibrated using a selected time base range. More specifically, calibration is performed in three sweep time ranges (in this example, since a 2 MHz clock is used for measuring time intervals, as will be later described, 50 μs/div for a range group 10 ns/div − 0.5 μs/div; 0.5 ms/div for a range group 1 μs/div − 0.5 ms/div; and 1 ms/div for a range group 1 ms/div − 0.5 s/div are used). The sweep waveform generator 10 is also provided with a current source (not shown) for supplying the capacitors with a charge current of a magnitude proportional to the magnitude of the slope specifying input $G_V$.

The cursor amplifier —has an input terminal for receiving a cursor setting voltage $V_C$ (which is set at $V_{CR}$ for the reference cursor and at $V_{CD}$ for the delta cursor) from a terminal b of the switch SW2, and an output terminal for applying a received input voltage amplified by a gain $G_C$ to a terminal b or the switch SW1. The horizontal deflection circuit 11 has an input terminal connected to the output terminal of the switch SW1, and an output terminal for delivering a pair of balanced deflection voltages generated by amplifying the input by a gain $G_H$. The output is connected to the pair of respective horizontal deflection plates 12 of the CRT. The detector 16, which is formed by a differential amplifier, has a pair of input terminals for receiving the pair of balanced deflection voltages and an output terminal for generating, in an unbalanced form, a voltage proportional to the difference voltage between the pair of deflection voltages (for example, −50 − +50 volts). The time interval measuring unit 17 having an input terminal connected to the output of the detector 16 also has an input terminal connected to receive a control signal from the system controller 14 and an output terminal for sending a signal representative of a measured time interval to a line L1.

Figure 2:
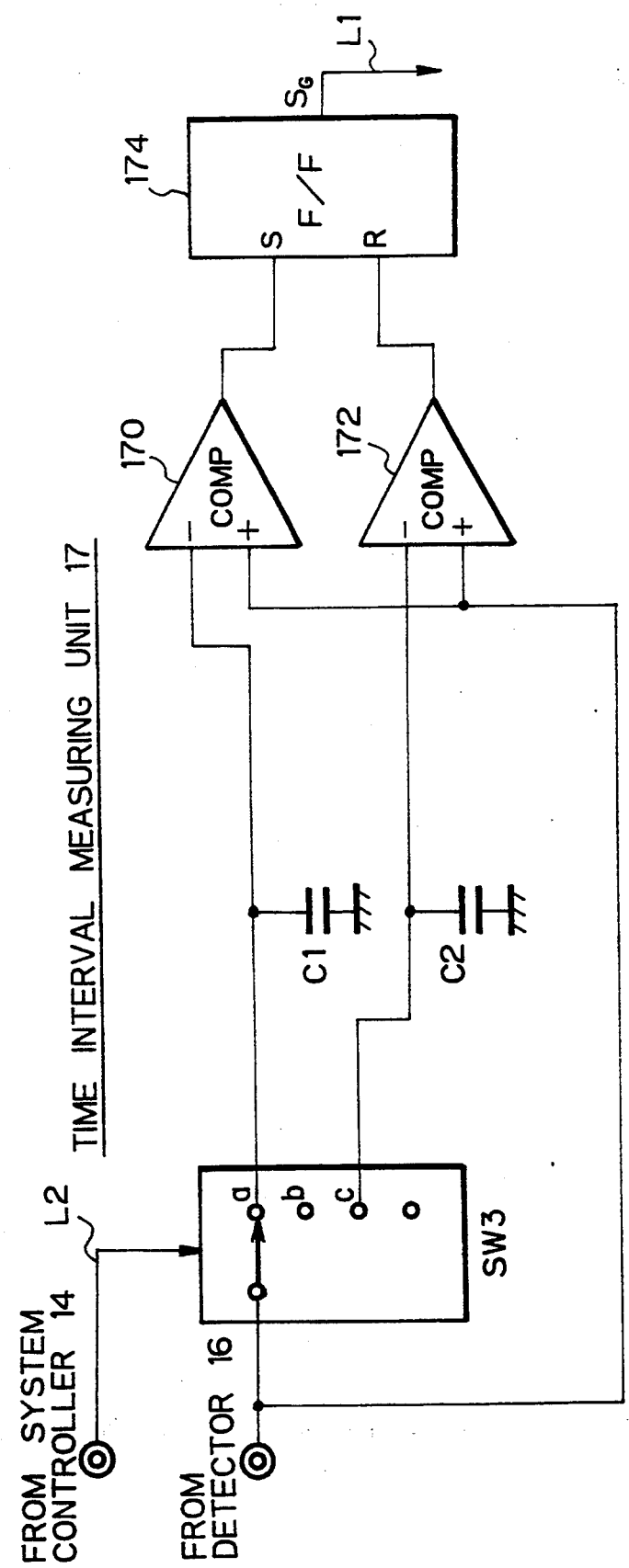
FIG. 2 is a circuit diagram showing a time interval measuring unit of FIG. 1 in greater detail.

FIG. 2 shows a circuit comprising the time interval measuring unit 17 in greater detail. As can be seen from the drawing, the circuit comprises a switch SW3, two capacitors C1 and C2, two comparators 170 and 172, and a flip-flop 174. The switch SW3 has an input terminal for receiving the output from the detector 16, three output terminals a, b and c, and a switching control input terminal connected to the system controller 14 through a line L2. Between the terminal a and the ground, there is connected the capacitor C1 for storing a voltage for the reference cursor $C_R$, while the capacitor C2 for storing a voltage for the delta cursor $C_D$ is arranged between the terminal c and the ground. The comparator 170 has an inverting input terminal connected to the upper terminal of the capacitor C1, a non-inverting input terminal connected to the output of the detector 16, and an output terminal at which a positive voltage is generated when the input to the non-inverting input terminal is larger than the input to the inverting input terminal. The comparator 172 has an inverting input terminal connected to the upper terminal of the capacitor C2, a non-inverting input terminal connected to the output of the detector 16, and an output terminal at which a positive voltage is generated when the input to the non-inverting input terminal is larger than the input to the inverting input terminal. The flip-flop 174 has a set terminal S connected to the output of the comparator 170, a reset terminal R connected to the output of the comparator 172, and an output terminal at which a positive voltage (constituting a gate signal $S_G$ representative of a measured time interval) is generated from a time the flip-flop 174 is set to a time it is reset. The output of the flip-flop 174 is connected to the line L1 which in turn is connected to the system controller 14.

Referring now to FIG. 1, the system controller 14 is next explained. The system controller 14 comprises a microcomputer (CPU) and a programmable interval timer TM (for example, Toshiba model 82C54) connected thereto. The system controller 14 has a program built therein for executing a calibration procedure, late referred to, and is provided with terminals for inputting and outputting data and control signals. Specifically, the terminals comprise an input terminal connected to the output of the measuring unit 17 through the line L1, an output terminal connected through the line L2 to the control input terminal of the switch SW3 in the measuring unit 17, an output terminal connected to an input terminal of the D/A convertor 15 through a line L3, an output terminal connected to the switching control input terminal of the switch SW1 through a line L4, and an output terminal connected to the switching control input terminal of the switch SW2 through a line L5. The interval timer TM has an input terminal for receiving a clock signal CK from a clock (not shown) generator built in the microcomputer, and another input terminal for receiving a signal on the line L1 as a gate signal.

Next, the operation off the cursor calibration according to the present invention will be explained. In the following example, description will be made as to calibration in one of time base ranges. The calibration operation of the present invention may be roughly divided into three stages. A first stage is a cursor generation stage in which each of two cursor voltages is generated and a corresponding output voltage appearing at the output terminal of the detector 16 is stored. A second stage is a sweep waveform generation stage. A third stage is a measurement/calculation stage in which an elapsed time between the two cursors is measured on the generated sweep waveform, and the slope of the sweep waveform is recalculated in accordance with the measurement results.

Figure 3:
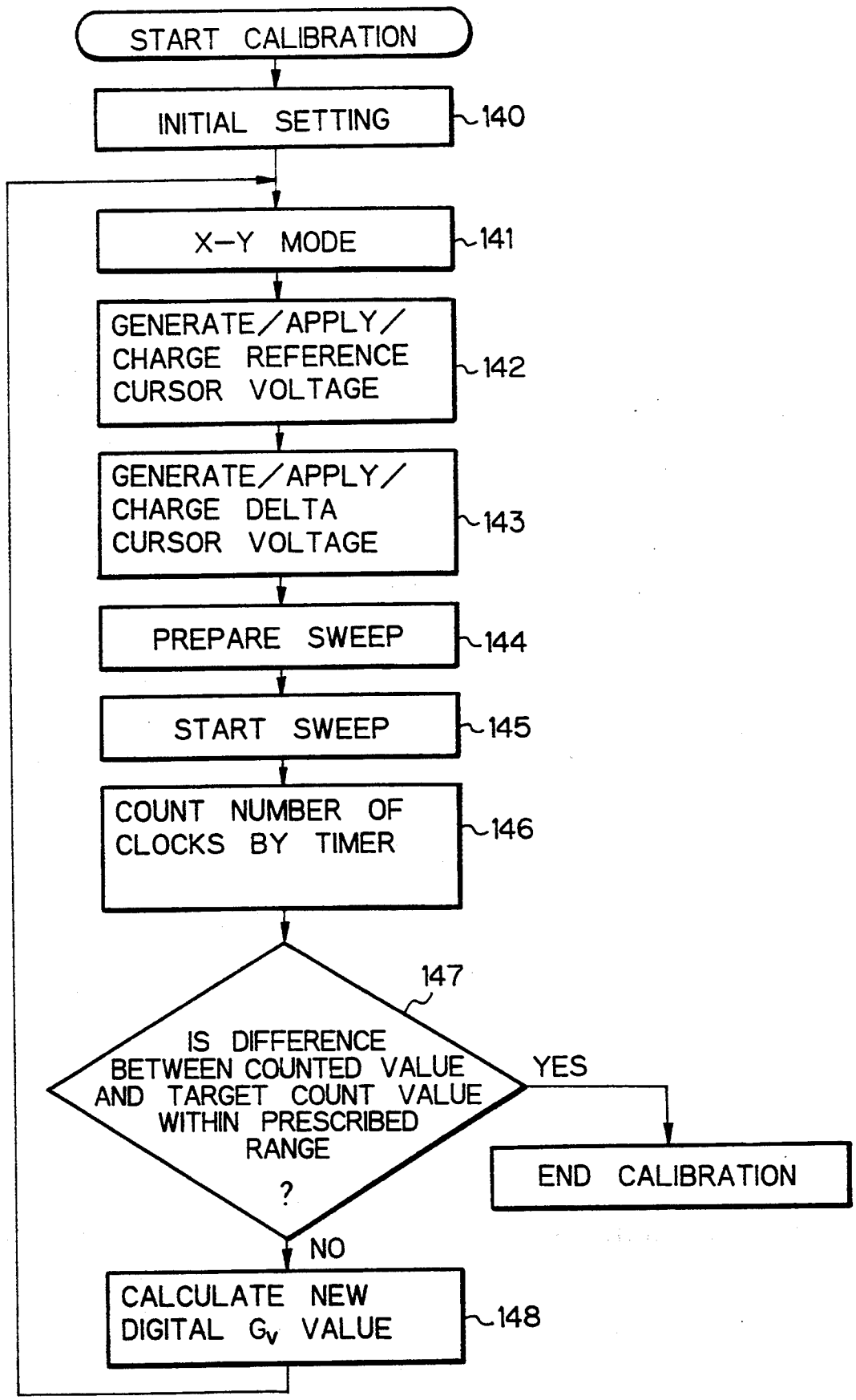
FIG. 3 is a flow chart showing a calibration procedure.
Figure 4A:
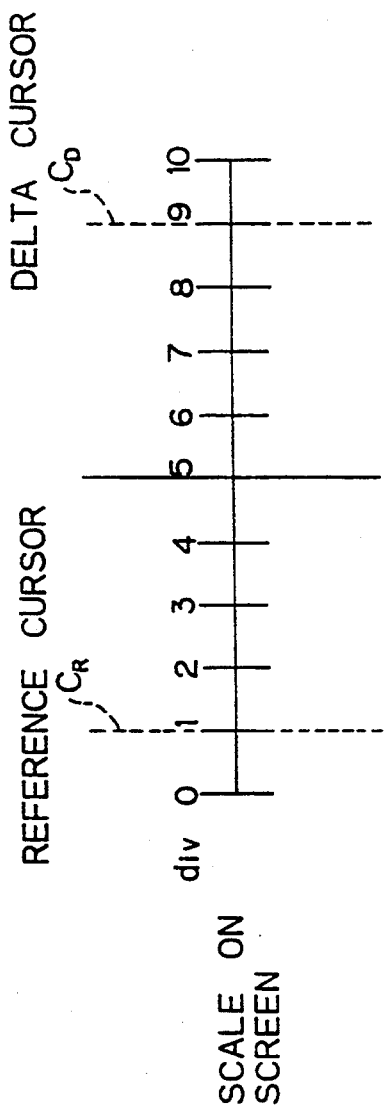
FIGS. 4A and 4B show several waveforms during calibration operation according to the present invention, a horizontal axis portion of the on-screen scale, and a pair of cursors displayed on the screen.
Figure 4B:
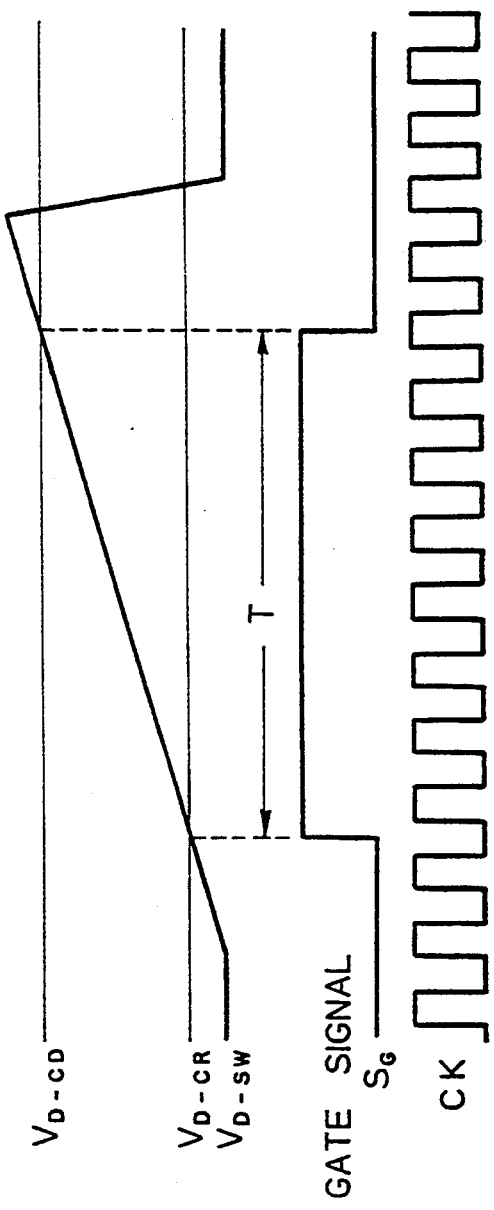

Explaining the operation in greater detail with reference to the flow chart in FIG. 3 showing the calibration procedure and FIG. 4, the calibration procedure starts at step 140. At this step, a time base range for performing the cursor calibration, positions at which the reference cursor $C_R$ and the delta cursor $C_D$ (shown in FIG. 4) are displayed, respectively, a count (or a target count) to which the timer is to count in the case (used later at step 147) are determined. For the purpose of explanation, it is assumed, by way of example, that the time base range for calibration is selected to be 1 ms/div, and the displayed positions (i.e. positions on the horizontal deflection input voltage coordinate) of the cursors $C_R$ and $C_D$ are respectively at div 1 and div 9 on the horizontal axis scale on the screen, as shown in FIG. 4. The period of the clock (2 MHz) to be counted is 0.5 μs, while a target gate time width of the timer TM is 8 ms, so that the target count $CT_T$ is 16,000 as expressed in decimal number. It should be noted in FIG. 4 that while the cursors $C_R$ and $C_D$ are shown superimposed at positions of div 1 and div 9 on the on-screen scale or physical scale, they may be displaced from the displayed positions on the screen. Such displacement (displacement between a position on the horizontal deflection input voltage coordinate and a position on the screen display coordinate) may be corrected by adjusting the gain $G_C$ of the cursor amplifier 13. Essentially, the cursors are generated at positions of div 1 and div 9 on the coordinate for an input voltage to the horizontal deflection circuit 11.

Next, at step 141, the oscilloscope is set to an X-Y display mode. When set In this mode, the CPU stops the sweep by a control signal not shown. Then, at step 142, for generation/application/charge of the reference cursor $C_R$, the lines L4, L5 and L2 are respectively set to binary "1", binary "1" and binary "0" for changing over the switch SW1 to the terminal b; SW2 to the terminal b; and the switch SW3 to the terminal a. Simultaneously with this, a digital voltage value corresponding to the scale position div 1 (199 H in hexadecimal which represents 0.5 volts) is generated on the line L3. Thus, an analog signal converted by the D/A convertor 15, i.e., 0.5 volts, is applied to the deflection circuit 11 through the switch SW2, the amplifier 13 and the switch SW1, and an output voltage of the circuit 11 detected by the detector 16 is stored or charged on the capacitor C1 through the switch SW3. After the lapse of a predetermined time required to complete the charging, a binary number "01" is generated on the line L2 to change over the switch SW3 to the terminal b. Here, the voltage charged on the capacitor C1 is represented by $V_{D-CR}$ (for example, −1.8 volts).

Next, at step 143, a binary number "10" is outputted onto the line L2 to change over the switch SW3 to the terminal c for performing operations similar to the foregoing for the della cursor $C_D$. Simultaneously, a digital voltage value corresponding to the scale position div 9 (E66H in hexadecimal which represents 4.5 volts) is generated on the line L3. Thus, similarly to the above, an analog voltage converted by the D/A convertor 15, i.e., 4.5 volts is applied to the deflection circuit 11 through the switch SW2, the amplifier 13 and the switch SW1, and an output voltage of the circuit 11 detected by the detector 16 is stored on the capacitor C2 through the switch SW3. After the lapse of a predetermined time required to complete the charging, a binary number "01" is generated on the line L2 to change over the switch SW3 to the terminal b. The voltage charged on the capacitor C2 is represented by $V_{D-CD}$ (for example, +1.8 volts). Although each cursor is indicated as a vertical broken line in FIG. 4, it is also necessary to input a step-like ramp waveform to a vertical deflection circuit (not shown) to display the cursor in that manner.

Next, at step 144, a binary number "0" is generated on the lines L4 and L5 to change over both the switches SW1 and SW2 to the terminals a for preparation of sweep. Next, a slope value $G_V$ in digital, form of a sweep waveform expected to provide a target gate width (or the target count) is generated on the line L3. The digital value, after converted to an analog value by the D/A convertor 15, is applied to the sweep waveform generator 10. Thereafter, at step 145, a sweep mode is set to AUTO, and a horizontal axis mode to A sweep by control signals of the CPU, not shown, for starting the sweep. (It should be noted that the oscilloscope incorporating the present invention has an A-sweep generator and a B-sweep generator. ) in this manner, a sweep waveform voltage $V_{SW}$ is generated and applied to the deflection circuit 11 through the switch SW1. Then, a detected output voltage $V_{D-SW}$ from the detector 16 (for example, −2.7 − +2.7 volts) representative of an output voltage of the deflection circuit 11 is applied to the non-inverting input terminals of the comparators 170 and 172 in the measuring unit 17. When the voltages $V_{D-CR}$, $V_{D-CD}$ and $V_{D-SW}$ are in relationship shown in FIG. 4, the flip-flop 174 generates a gate signal $S_G$ which becomes high at a position corresponding to div 1 on the horizontal deflection voltage coordinate and goes low at a position corresponding to div 9 on the coordinate. Tile gate signal is applied to the timer TM off the system controller 14 through the line L1.

Next, at step 146, the timer TM in the system controller 14 is instructed to count the clock CK during a high period T of the gate signal $S_G$ to derive a measured binary count value $CT_M$. Then it is determined whether or not the difference between the count value $CT_M$ and the above binary target count value $CT_T$ is within a prescribed range. In this embodiment, the tolerance is selected to be ±1 in binary number. If the difference is out of the tolerable range, the digital value $G_V$ is increased or decreased at the next step in the direction in which the count difference enters the tolerable range. Thereafter, the procedure returns to step 141 to repeat the operations described above using the new digital value $G_V$.

If the decision at step 147 is affirmative indicating that the difference between the count value $CT_M$ and the target count value $CT_T$ is within a prescribed range, the digital value $G_V$ at that time Is determined as the final slope value for the sweep waveform, thus completing the calibration procedure. The above explanation relates to the cursor calibration performed in a single time base range. For calibration in the remaining two of the selected three time base ranges, i.e., 0.5 ms/div and 50 µs/div, the calibration procedure shown in FIG. 4 may be repeated.

The above described calibration procedure permits the difference in horizontal axis voltage between the reference and delta cursors, i.e., the pair of cursors, to highly accurately indicate a time difference on each of time base ranges in which the calibration is effective. As a result, upon reading a numerical value in an actual measurement, when the reference and delta cursors are positioned on both ends of a portion on the display screen to be measured, a time between the cursors can be accurately calculated from the difference in digital voltage values stored in the CPU for the pair of cursors. Further, the reading is more accurate than a reading derived on the basis of an on-screen scale or physical scale and a displayed waveform.

While one embodiment of the present invention has been described above, modifications as set forth below may be made thereto.

First, the number of time base ranges used for calibration may be increased or decreased. The calibration of the present invention may be carried out for all of the time base ranges of an oscilloscope, if necessary. Secondly, in an oscilloscope provided with two or more sweep generators, the calibration of the present invention may be performed for each of the sweep generators. For example, as previously stated, the calibration may be repeated for the B-sweep generator (for delay sweep). Thirdly, while div 1 and div 9 are used as positions for calibrating the cursors $C_R$ and $C_D$ in order to perform calibration in a highly linear portion of a sweep waveform, other positions may also be utilized for calibration. Further, the time interval T may be measured by any other method than the one illustrated above, as long as information representative of T can be derived. Furthermore, the number of cursors may be more than two, in which case any two of such cursors may be calibrated.

According to the present invention as described above, electronic scales for the horizontal axis can be calibrated in a high accuracy. Also, since the electronic scales are directly calibrated, it is possible to improve the accuracy of measurements, e.g., the, numerical readings, using the electronic scales.

What is claimed is:

1. A method of calibrating electronic scales for the horizontal axis of an oscilloscope having a screen, comprising the steps of:
   for at least first and second individually and horizontally movable electronic scales for the horizontal axis, determining first and second electronic scale signals having values corresponding to displayed positions of said first and second electronic scales on the screen of said oscilloscope:
   sequentially applying said first and second electronic scale signals to a horizontal deflection circuit to derive a first deflection output and a second deflection output from an output of said horizontal deflection circuit;
   generating a sweep waveform comprising a sweeping waveform portion having an adjustable slope;
   applying said sweep waveform to said horizontal deflection circuit to derive a third deflection output from said horizontal deflection circuit in response to said sweep waveform;
   measuring a time interval from a time at which a portion of said third deflection output corresponding to said sweeping waveform portion takes the value of said first deflection output to a time at which said portion takes the value of said second deflection output; and
   adjusting the slope of said sweep waveform in response to said measured time interval and a target time interval between said displayed positions of said first and second electronic scales.

2. A calibration method according to claim 1, wherein said horizontal axis forms a time base in a sweep mode of said oscilloscope.

3. A calibration method according to claim 1, wherein said first and second electronic scales are a reference cursor and a delta cursor.

4. A calibration method according to claim 1, wherein said first and second electronic scales are calibrated in at least one time base range of said oscilloscope.

5. A calibration method according to claim 1, wherein said first and second scales are calibrated with respect to each of sweep waveforms generated by at least one sweep waveform generating means.

6. In an oscilloscope having a display screen, said oscilloscope comprising:
   a horizontal deflection circuit;
   electronic scale signal generating means for generating, for at least first and second individually and horizontally movable electronic scales for the horizontal axis displayed on said screen, said first and second electronic scale signals having values corresponding to displayed positions of said first and second electronic scales on the screen of said oscilloscope; and
   sweep waveform generating means for generating a sweep waveform comprising
   a sweeping waveform portion having an adjustable slope,
   a calibration apparatus for calibrating electronic scales for the horizontal axis comprising:
   detecting means for detecting an output of said horizontal deflection circuit;
   time interval measuring means coupled to receive an output from said detecting means, said measuring means being operative to receive a first detected output and a second detected output from said detecting means, said first and second detected outputs being generated when said first and second electronic scale signals are sequentially applied to said horizontal deflection circuit, said measuring means being responsive to receive a third detected output from said detecting means which is derived when said sweep waveform is applied to said horizontal deflection circuit, said measuring means being operative to generate a measured time interval signal representative of a time interval between a time at which a portion of said third detected output corresponding to said sweeping waveform portion takes the value of said first detected output and a time at which said portion takes the value of said second detected output; and control means responsive to the value of said measured time interval and the value of a target time interval between the displayed positions of said first and second electronic scales for generating a control signal to be applied to said sweep waveform generating means in order to adjust the slope of said sweep waveform.

7. A calibration apparatus according to claim 6, wherein said time interval measuring means comprises:

first and second memory means for storing said first and second detected outputs, respectively;

first comparator means for comparing said third detected output with said first detected output stored in said first memory means to generate a first signal when the magnitude of said third detected output is higher than the magnitude of said first detected output;

second comparator means for comparing said third detected output with said second detected output stored in said second memory means to generate a second signal when the magnitude of said third detected output is higher than the magnitude of said second detected output; and a flip-flop coupled to said first and second comparator means for generating a pulse having a width corresponding to a time period from a time at which said first signal is generated to a time at which said second signal is generated, and said control means comprises:

clock generating means for generating a clock at a predetermined frequency; and counter means coupled to receive said clock and said pulse from said flip-flop for counting the number of said clocks generated during the duration of said pulse.

8. A calibration apparatus according to claim 6, wherein said first and second electronic scales are calibrated in at least one time base range of said oscilloscope.

9. A calibration apparatus according to claim 6, wherein said first and second electronic scales are calibrated with respect to each of sweep waveforms generated by at least one sweep waveform generating means.

10. An oscilloscope having a display screen comprising:

a horizontal deflection circuit;

electronic scale signal generating means for generating, for at least first and second individually and horizontally movable electronic scales for the horizontal axis displayed on said screen, Said first and second electronic scale signals having values corresponding to display positions of said first and second electronic scales on the screen of said oscilloscope;

sweep waveform generating means for generating a sweep waveform comprising a sweeping waveform portion having an adjustable slope;

detecting means for detecting an output of said horizontal deflection circuit;

time interval measuring means coupled to receive an output from said detecting means, said measuring means being operative to receive a first detected output and a second detected output from said detecting means, said first and second detected outputs being generated when said first and second electronic scale signals are sequentially applied to said horizontal deflection circuit, said measuring means being operative to receive a third detected output from said detecting means which is derived when said sweep waveform is applied to said horizontal deflection circuit, said measuring means being operative to generate a measured time interval signal representative of a time interval between a time at which a portion of said third detected output corresponding to said sweeping waveform portion takes the value of said first detected output and a time at which said portion takes the value of said second detected output; and control means responsive to the value of said measured time interval and the value of a target time interval between the displayed positions of said first and second electronic scales for generating a control signal to be applied to said sweep waveform generating means in order to adjust the slope of said sweep waveform.

* * * * *